United States Patent
Fung

(10) Patent No.: US 8,338,909 B2
(45) Date of Patent: Dec. 25, 2012

(54) TWO-STEP STI FORMATION PROCESS

(75) Inventor: Ka-Hing Fung, Hsin-Chu (TW)

(73) Assignee: Taiwan Semiconductor Manufactuirng Company, Ltd., Hsin-Chu (TW)

( * ) Notice: Subject to any disclaimer, the term of this patent is extended or adjusted under 35 U.S.C. 154(b) by 127 days.

(21) Appl. No.: 12/910,638

(22) Filed: Oct. 22, 2010

(65) Prior Publication Data

US 2011/0031541 A1 Feb. 10, 2011

Related U.S. Application Data

(63) Continuation of application No. 12/127,646, filed on May 27, 2008, now Pat. No. 7,842,577.

(51) Int. Cl.
*H01L 21/70* (2006.01)
*H01L 21/336* (2006.01)

(52) U.S. Cl. ......... 257/506; 257/E21.564; 257/E21.561; 257/E21.545; 438/164; 438/294; 438/295

(58) Field of Classification Search .................. 438/164, 438/294, 295; 257/E21.546, E21.545, E21.561, 257/E21.564, 506
See application file for complete search history.

(56) References Cited

U.S. PATENT DOCUMENTS

| 5,874,328 | A | 2/1999 | Liu et al. |
| 6,927,114 | B2 | 8/2005 | Park |
| 7,230,270 | B2 | 6/2007 | Chen et al. |
| 2002/0113288 | A1 | 8/2002 | Clevenger et al. |
| 2004/0171197 | A1 | 9/2004 | Park |
| 2006/0086987 | A1 | 4/2006 | Chen et al. |
| 2006/0108644 | A1 | 5/2006 | Chen et al. |
| 2007/0066030 | A1* | 3/2007 | Kim .............................. 438/427 |
| 2008/0265365 | A1* | 10/2008 | Frohberg et al. ................ 257/513 |
| 2009/0278201 | A1* | 11/2009 | Chatty et al. .................. 257/347 |

FOREIGN PATENT DOCUMENTS

| CN | 1525552 A | 9/2004 |
| CN | 1797762 A | 7/2006 |

* cited by examiner

*Primary Examiner* — Ha Tran T Nguyen
*Assistant Examiner* — Aaron Dehne
(74) *Attorney, Agent, or Firm* — Slater & Matsil, L.L.P.

(57) ABSTRACT

A method of forming an integrated circuit structure includes providing a semiconductor substrate; forming a first isolation region in the semiconductor substrate; after the step of forming the first isolation region, forming a metal-oxide-semiconductor (MOS) device at a surface of the semiconductor substrate, wherein the step of forming the MOS device comprises forming a source/drain region; and after the step of forming the MOS device, forming a second isolation region in the semiconductor substrate.

16 Claims, 11 Drawing Sheets

TWO-STEP STI FORMATION PROCESS

This application is a continuation of U.S. patent application Ser. No. 12/127,646, filed May 27, 2008, and entitled "Two-Step STI Formation Process," which application is hereby incorporated herein by reference.

TECHNICAL FIELD

This invention relates generally to integrated circuits, and more particularly to the formation of isolation structures for separating integrated circuits.

BACKGROUND

Modern integrated circuits are formed on the surfaces of semiconductor substrates, which are mostly silicon substrates. Semiconductor devices are isolated from each other by isolation structures formed close to the surface of the respective semiconductor substrates. The isolation structures include field oxides and shallow trench isolation (STI) regions.

Field oxides are often formed using local oxidation of silicon (LOCOS). A typical formation process includes blanket forming a mask layer on a silicon substrate, and then patterning the mask layer to expose certain areas of the underlying silicon substrate. A thermal oxidation is then performed in an oxygen-containing environment to oxidize the exposed portions of the silicon substrate. The mask layer is then removed.

With the down-scaling of integrated circuits, STI regions are increasingly used as the isolation structures. FIG. 1 illustrates a top view of an integrated circuit structure, which includes metal-oxide-semiconductor (MOS) devices 2 and 12. MOS device 2 includes gate poly 4 formed over active region 6. MOS device 12 includes gate poly 14 formed over active region 16. Active regions 6 and 16 are separated from each other and from other devices by STI regions 8, which include STI strips 8$_1$ parallel to the gate length direction (source-to-drain direction) of MOS devices 2 and 12, and STI strips 8$_2$ parallel to the gate width direction.

The formation of STI regions 8 is typically performed before the formation of MOS devices. During the subsequent high-temperature process steps, which may be performed at temperatures as high as about 700° C., stresses are generated due to the different coefficients of thermal expansion between STI regions 8 and active regions 6 and 16. STI regions 8 thus apply stresses to active regions 6 and 16, affecting the performance of MOS devices 2 and 12. In addition, the formation of source/drain regions requires dopant implantations. In the portions of active regions 6 and 16 near STI regions 8, dopant concentrations may have fluctuations due to the diffusion of the dopants into STI regions 8.

To make the situation worse, typically, the width W1 of STI strips 8$_1$ is greater than width W2 of STI strips 8$_2$. Voids are thus more likely to be generated in STI regions 8$_2$. This causes the stresses generated by STI regions 8$_2$ in the gate length direction to be adversely changed. Accordingly, what is needed in the art is a method for solving the above-discussed problems.

SUMMARY OF THE INVENTION

In accordance with one aspect of the present invention, a method of forming an integrated circuit structure includes providing a semiconductor substrate; forming a first isolation region in the semiconductor substrate; after the step of forming the first isolation region, forming a metal-oxide-semiconductor (MOS) device at a surface of the semiconductor substrate, wherein the step of forming the MOS device includes forming a source/drain region; and after the step of forming the MOS device, forming a second isolation region in the semiconductor substrate.

In accordance with another aspect of the present invention, a method of forming an integrated circuit structure includes providing a semiconductor substrate; and forming a MOS device, which includes forming a gate stack on a top surface of the semiconductor substrate; forming a gate spacer on a sidewall of the gate stack; forming a source/drain region adjacent the gate spacer; and forming a silicide region on the source/drain region. The method further includes etching a portion of the silicide region and a portion of the source/drain region to form a trench, wherein the trench is spaced apart from an outer edge of the gate spacer by a remaining portion of the source/drain region, and wherein the trench extends below a bottom of the source/drain region; and forming an inter-layer dielectric (ILD) over the MOS device, wherein the ILD extends into the trench to form a shallow trench isolation (STI) region.

In accordance with yet another aspect of the present invention, a method of forming an integrated circuit structure includes providing a semiconductor substrate; forming a first STI region in the semiconductor substrate, wherein the first STI region has a first lengthwise direction, and wherein the first STI region adjoins an active region; forming a first and a second gate electrode strip over the active region and the first STI region, wherein the first and the second gate electrodes are parallel to each other; forming a common source/drain region in the active region and between the first and the second gate electrodes; forming a silicide region on the common source/drain region; etching a portion of the silicide region and a portion of the common source/drain region to form a trench, wherein the trench has a second lengthwise direction parallel to the first and the second gate electrode strips; and forming an ILD having a top surface higher than top surfaces of the first and the second gate electrode strips, wherein the ILD extends into the trench to form a second STI region.

In accordance with yet another aspect of the present invention, an integrated circuit structure includes a semiconductor substrate including an active region; a first STI region adjoining a first side of the active region; a gate electrode over the active region and the first STI region; a source/drain region adjacent the gate electrode; a trench in the semiconductor substrate and adjoining a second side of the active region, wherein the trench has a bottom no higher than a bottom of the source/drain region; and an ILD extending from over the gate electrode to inside the trench, wherein a portion of the ILD in the trench forms a second STI region.

In accordance with yet another aspect of the present invention, an integrated circuit structure includes a semiconductor substrate including an active region; a first STI region adjoining a first side of the active region; and a MOS device. The MOS device includes a gate stack on the active region and the first STI region; a source/drain region adjacent the gate stack and in a portion of the active region; and a source/drain silicide region on the source/drain region. The integrated circuit structure further includes a second STI region adjoining a second side of the source/drain region perpendicular to the first side, wherein first top surfaces of first portions of the source/drain region and the source/drain silicide region adjoining the second STI region are flatter than second top surfaces of second portions of the source/drain region and the source/drain silicide region adjoining the first STI region.

In accordance with yet another aspect of the present invention, an integrated circuit structure includes a semiconductor substrate including a first and a second active region; a first STI region in the semiconductor substrate, wherein the first STI region has a first lengthwise direction, and wherein the first STI region adjoins the first and the second active regions; a first gate electrode strip over the first active region and the first STI region; a second gate electrode strip over the second active region and the first STI region, wherein the first and the second gate electrode strips are substantially parallel to each other; a first source/drain region in the first active region and adjacent the first gate electrode strip; a first source/drain silicide region on the first source/drain region; a second source/drain region in the second active region and adjacent the second gate electrode strip; a second source/drain silicide region on the second source/drain region; and an ILD having a top surface higher than top surfaces of the first and the second gate electrode strips, wherein the ILD extends into the trench to form a second STI region adjoining the first and the second source/drain regions.

An advantageous feature of the present invention is that undesirable stresses to MOS devices are reduced, particularly in the gate length direction of the MOS devices. The performance of the MOS devices may thus be improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming shallow trench isolation (STI) regions and the resulting structures are provided. The intermediate stages of manufacturing preferred embodiments of the present invention are illustrated. The variations of the preferred embodiments are then discussed. Throughout the various views and illustrative embodiments of the present invention, like reference numbers are used to designate like elements.

Figure 1:
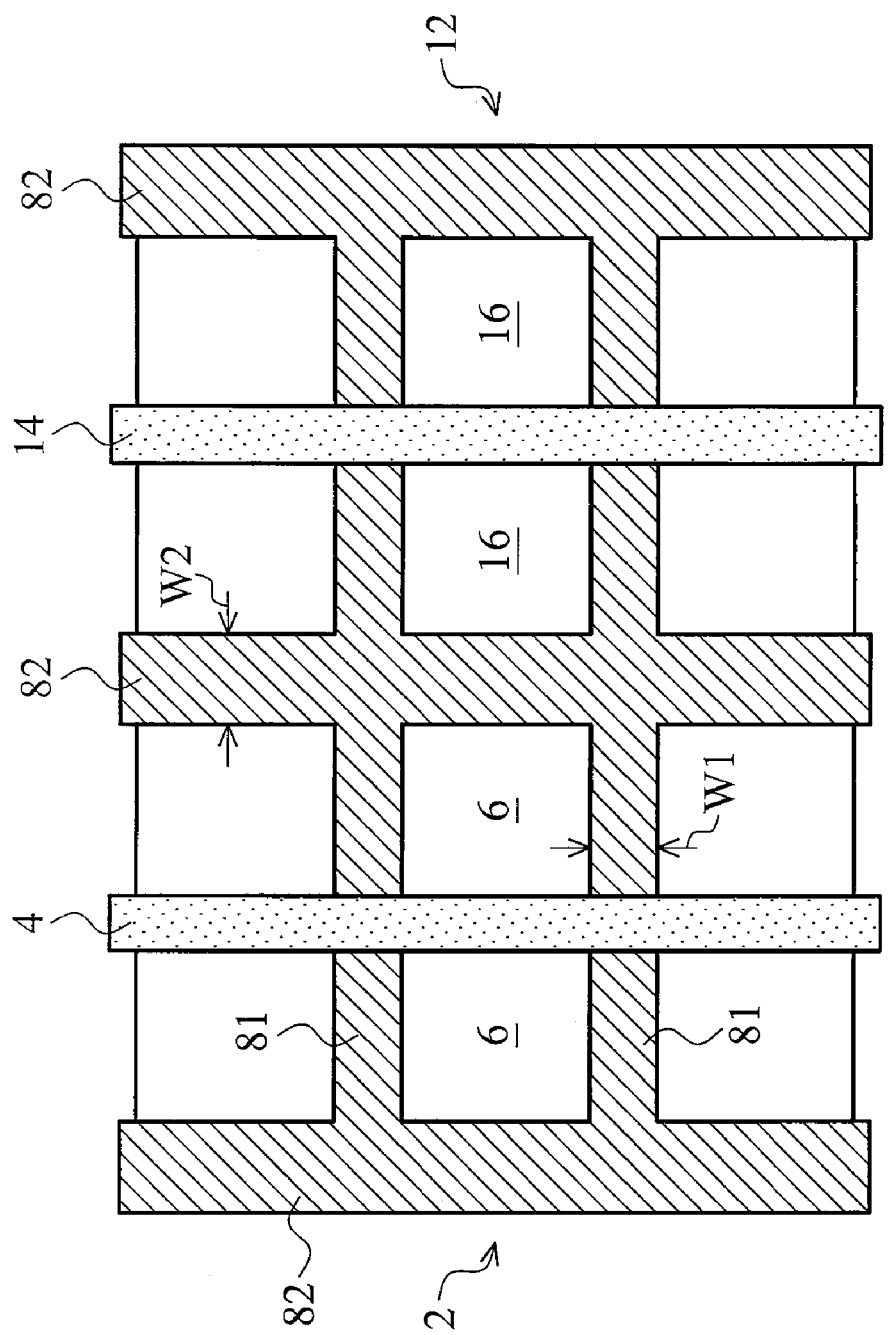
FIG. 1 illustrates a top view of a conventional integrated circuit structure, wherein metal-oxide-semiconductor (MOS) devices are isolated from each other by shallow trench isolation regions.
Figure 2A:
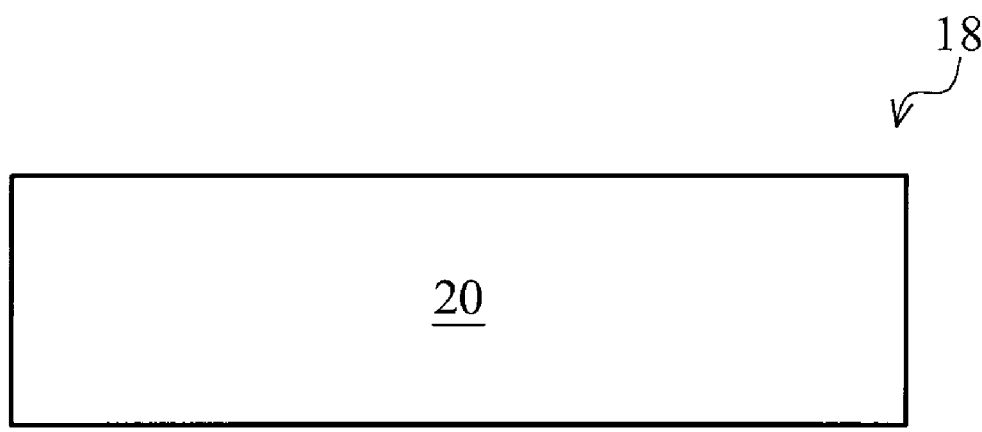
FIGS. 2A through 8 are cross-sectional views and top views of intermediate stages in the manufacturing of embodiments of the present invention.
Figure 2B:
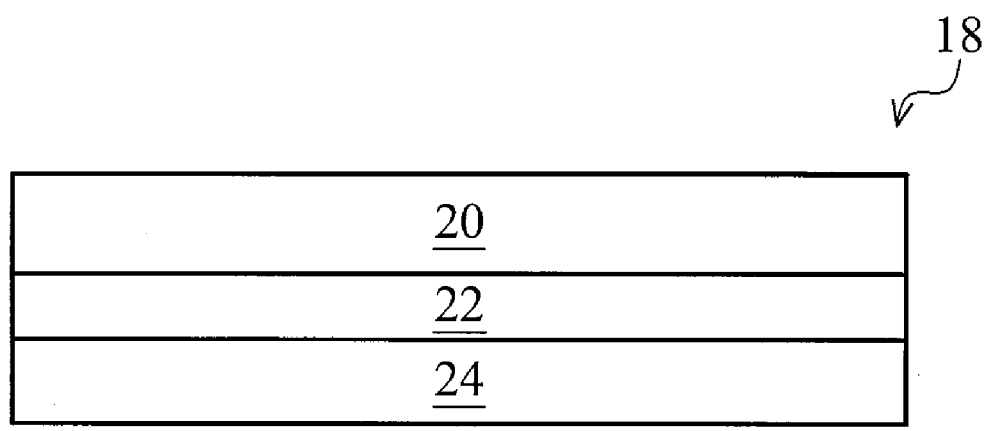

FIGS. 2A and 2B illustrate cross-sectional views of semiconductor chip 18, which include semiconductor substrate 20. In an embodiment, as illustrated in FIG. 2A, semiconductor substrate 20 is formed of a bulk semiconductor material such as silicon. In alternative embodiments, as illustrated in FIG. 2B, semiconductor chip 18 has a semiconductor-on-insulator (SOI) structure, with semiconductor substrate 20 located on a buried oxide (BOX) layer 22, which is further located on another semiconductor layer 24.

Figure 3A:
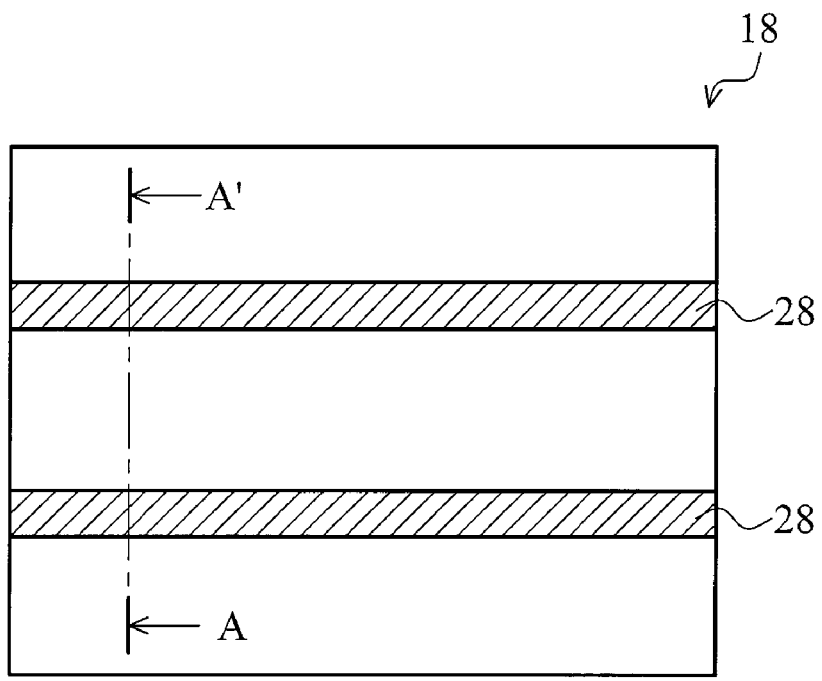
Figure 3B:
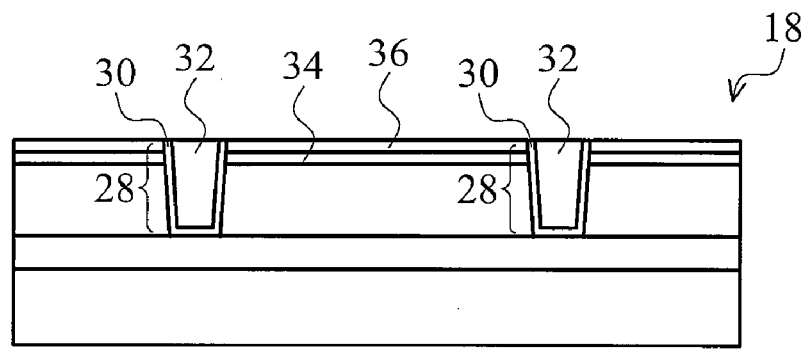

FIG. 3A illustrates a top view of the formation of STI regions 28 in semiconductor chip 18. In the illustrated region of semiconductor chip 18, two parallel STI regions 28 are formed. FIG. 3B illustrates a cross-sectional view of the structure shown in FIG. 3A, wherein the cross-sectional view is taken along a plane crossing line A-A' in FIG. 3A. An exemplary formation process of STI regions 28 is briefly discussed as follows with reference to FIG. 3B. First, pad layer 34 and hard mask layer 36 are formed on substrate 20, followed by the formation of trenches (the spaces occupied by STI regions 28). The trenches may be formed by anisotropic plasma etching, for example, using fluorine-containing chemicals. In the case semiconductor chip 18 has an SOI structure, the trenches may have a depth equal to the depth of the semiconductor substrate 20, so that the subsequently formed STI regions 28 physically contact BOX layer 22.

Next, trench liners 30 are formed in the trenches, using thermal oxidation. Accordingly, trench liners 30 may include silicon oxide, although other dielectric materials may also be used. Next, dielectric material 32 is filled into the remaining portion of the trenches. The filling of dielectric material 32 may be performed using high-density plasma chemical vapor deposition (HDPVD). However, other commonly used methods such as high aspect-ratio process (HARP), sub-atmospheric CVD (SACVD) and spin-on can also be used. A chemical mechanical polish (CMP) is then performed to remove excess dielectric material 32 over hard mask 36. Next, hard mask 36 and pad layer 34 are removed, leaving STI regions 28 in the trenches.

Figure 4A:
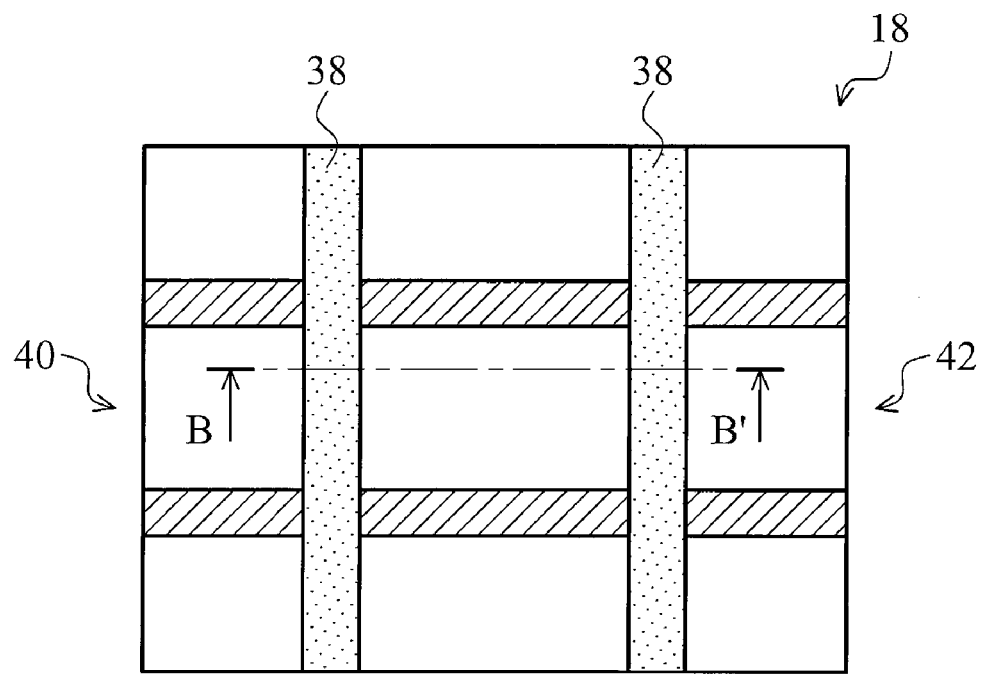
Figure 4B:
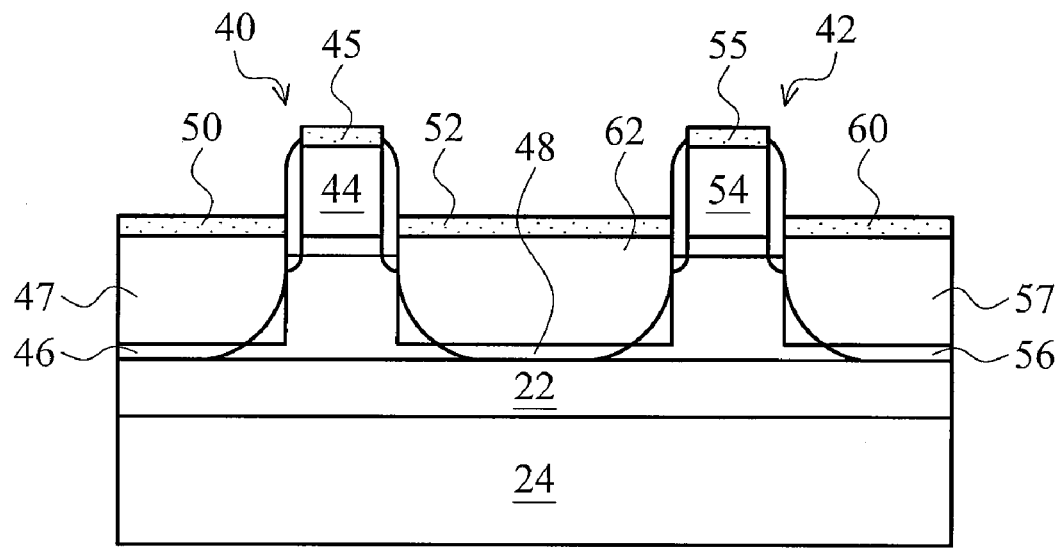
Figure 10:
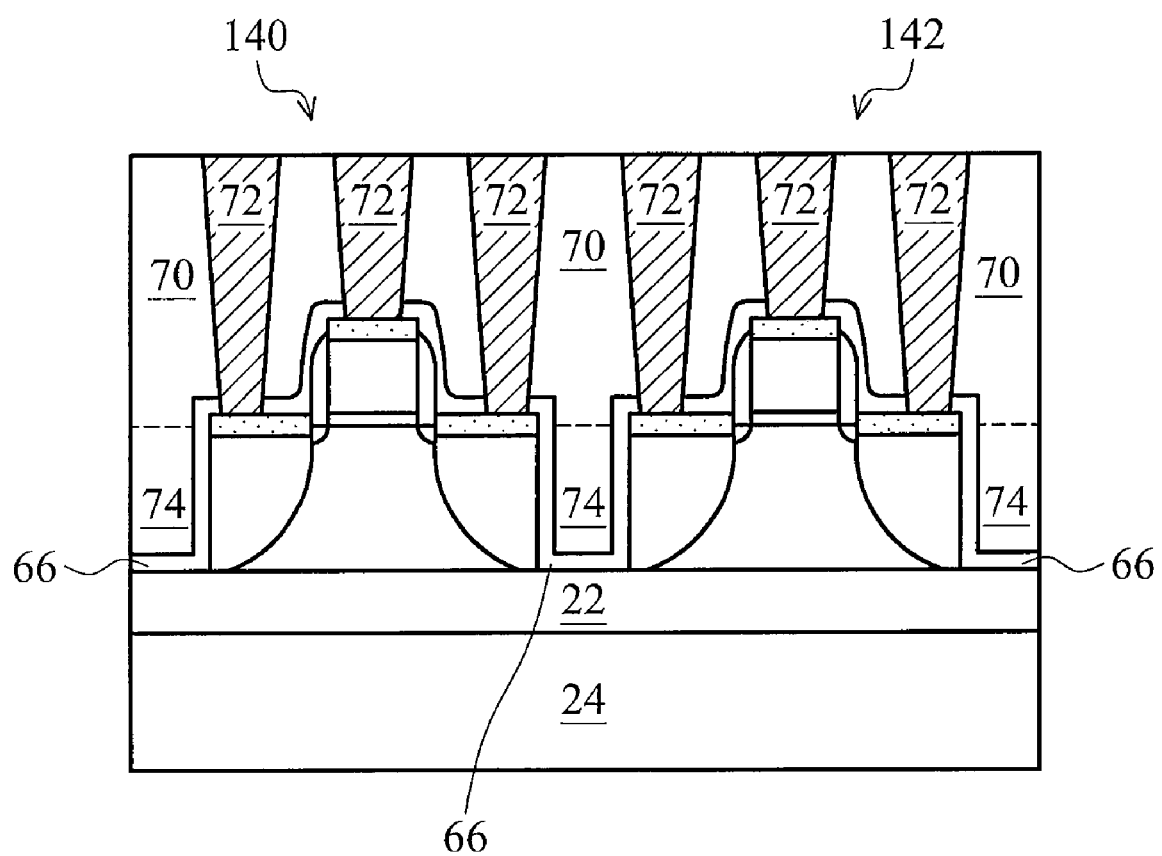
FIG. 10 illustrates an NMOS embodiment of the present invention.

Next, as shown in FIGS. 4A and 4B, gate electrodes 38 (and underlying gate dielectrics, not shown) are formed, wherein gate electrodes 38 form portions of the resulting MOS devices 40 and 42. In an exemplary embodiment as shown in FIG. 4B, MOS devices 40 and 42 are PMOS devices. In alternative embodiments, as shown in FIG. 10, MOS devices (which are renamed as MOS devices 140 and 142) are NMOS devices. In yet other embodiments, MOS devices 40 and 42 include one PMOS device and one NMOS device. MOS device 40 includes gate 44 (a portion of one of the gate electrodes 38), source/drain regions 46 and 48 (extending from respective source/drain silicides 50 and 52 to BOX layer 22), source/drain silicide 50 and 52, and optional silicon germanium (SiGe) stressors 47 and 62. MOS device 42 includes gate 54 (a portion of one of the gate electrodes 38), source/drain regions 48 and 56, source/drain silicides 52 and 60, and optional SiGe stressors 57 and 62. MOS devices 40 and 42 share common source/drain region 48, source/drain silicide 52, and SiGe stressor 62. Gate silicides 45 and 55 may also be formed on gates 44 and 54, respectively. The formation details of MOS devices 40 and 42 are known in the art, and hence are not repeated herein. As is known in the art, the formation of MOS devices 40 and 42 may include several high-temperature processes, such as the activation of source/drain regions 46, 48, and 56, and the formation of silicide regions 50, 52, and 60. During the high-temperature steps, the temperatures may be as high as about 700° C.

Figure 5:
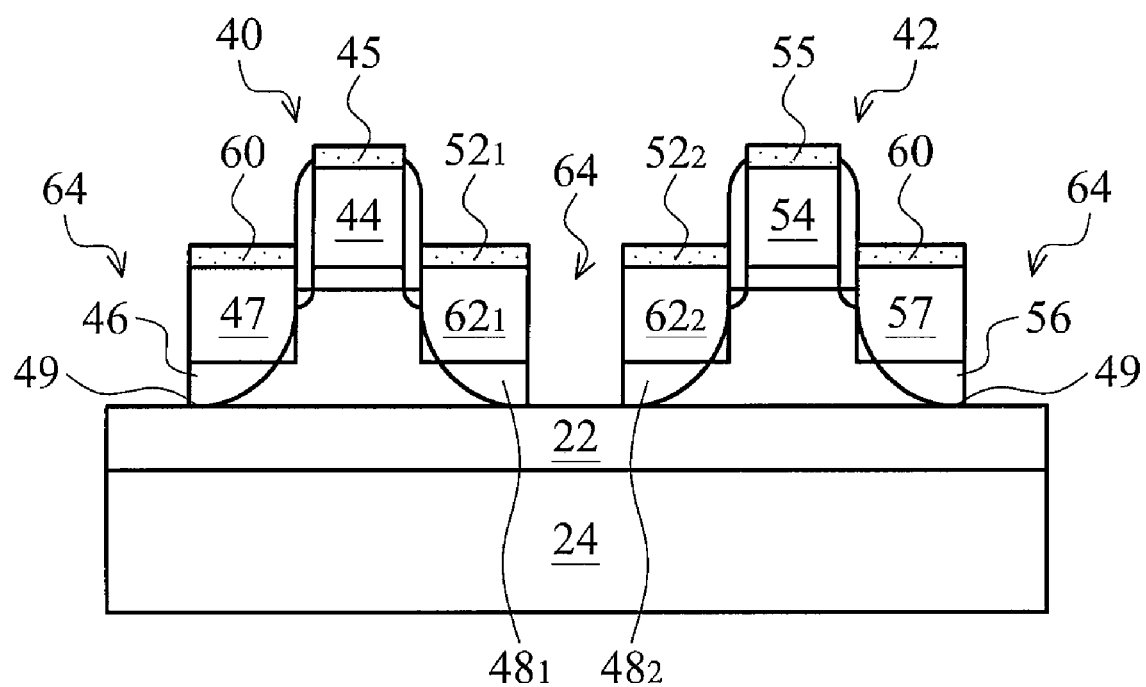

Referring to FIG. 5, after the high-temperature steps have been performed, trenches 64 are formed to cut into substrate 20. Trenches 64 are perpendicular to STI regions 28 in a top view (refer to FIG. 6B, wherein STI region 74 is formed in trenches 64). In the case semiconductor chip 18 has the SOI structure, trenches 64 extend deep enough, so that BOX layer 22 is exposed. In the case semiconductor chip 18 is a bulk substrate, trenches 64 extend to below the bottoms 49 of source/drain region 48, for example, to a depth comparable to that of STI regions 28. One of the trenches 64 separates each of the commonly shared source/drain region 48, source/drain silicide 52, and SiGe stressor 62 to a first portion (denoted with subscript "1") belonging to MOS device 40, and a second portion (denoted with subscript "2") belonging to MOS device 42. Since trenches 64 are formed after the formation of source/drain region 48, source/drain silicide 52, and SiGe stressor 62, the top surfaces of source/drain regions $48_1$ and $48_2$ and source/drain silicide regions $52_1$ and $52_2$ may each include an edge portion substantially flat, particularly the edge portions in a middle position between two STI regions 28 (refer to FIG. 6B). As a comparison, the portions of source/drain regions $48_1$ and $48_2$ and source/drain silicide regions $52_1$ and $52_2$ adjoining STI regions 28 are less flat, for example, with a profile as shown in FIG. 6C, which is a cross-sectional view taken along a plane along line C-C' in FIG. 6B.

Figure 6A:
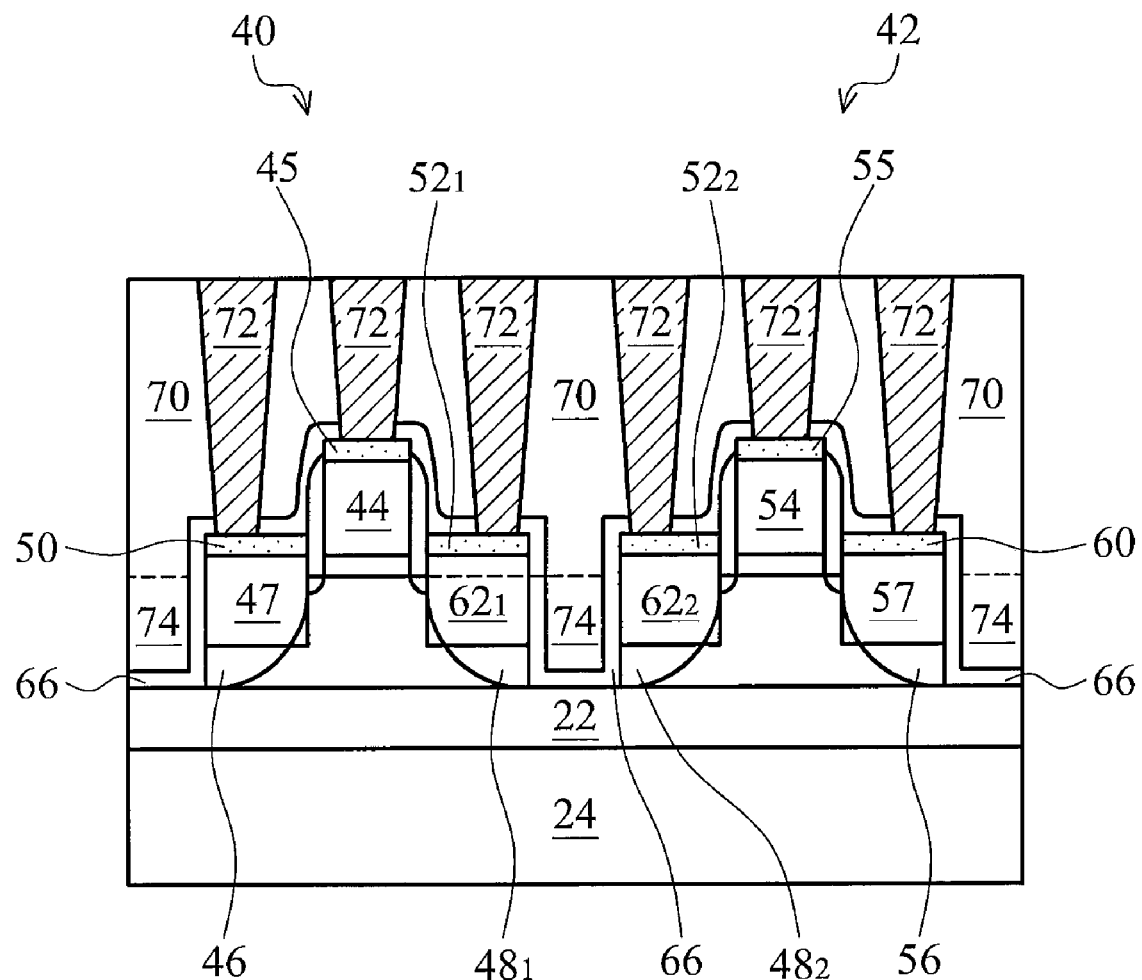

FIG. 6A illustrates the formation of contact etch stop layer (CESL) 66, inter-layer dielectric (ILD) 70, and contact plugs 72. Contact etch stop layer 66 is first blanket formed, followed by the formation of ILD 70. CESL 66 may be formed of silicon nitride or other materials such as silicon oxy-nitride. As is known in the art, CESL 66 may apply a stress to the underlying MOS devices 40 and 42 to improve the carrier mobility. ILD 70 may include silicon oxide formed using, for example, SACVD. Alternatively, ILD 70 may include boron-phosphosilicate glass (BPSG), phosphosilicate glass (PSG), or the like. Relatively low-temperatures are needed for the formation of CESL 66 and ILD 70, wherein the temperatures may be about 450° C. or lower, for example, about 400° C. CESL 66 and ILD 70 extend into trenches 64. Throughout the description, the portions of CESL 66 and ILD 70 underlying the top surface of silicon substrate 20 are referred to as STI regions 74. In alternative embodiments, before the formation of ILD 70, a dielectric material may be filled into trenches 64 to form STI regions 74, followed by the formation of CESL 66 and ILD 70. In this case, the dielectric material in trench 64 may be different from that of ILD 70.

Figure 6B:
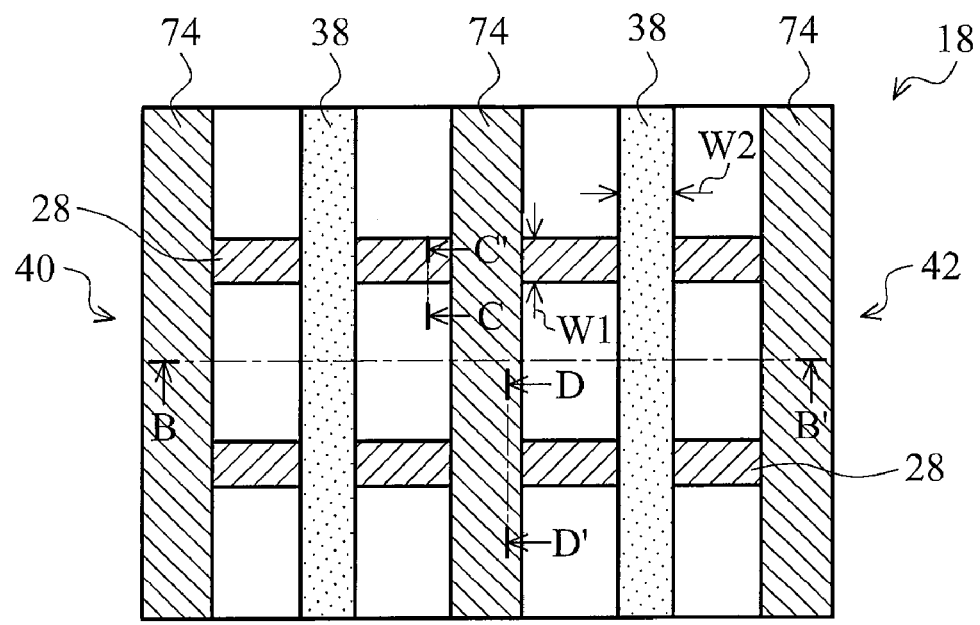
Figure 6C:
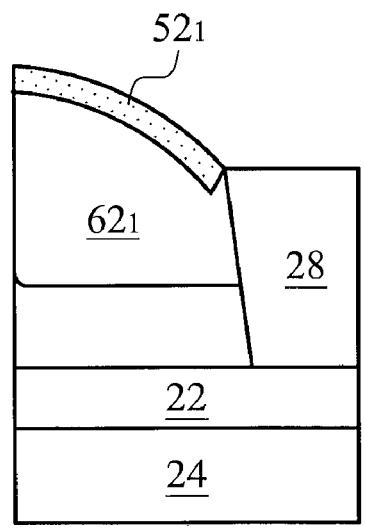

FIG. 6B illustrates a top view of the structure shown in FIG. 6A, and the cross-sectional view shown in FIG. 6A is taken along the plane crossing line B-B' as shown in FIG. 6B. The top view shows that gate electrode strips 38 crosses over STI regions 28, while STI regions 74 do not cross any gate electrode strip.

Next, as also shown in FIG. 6A, openings (occupied by contact plugs 72) are formed in ILD 70 and CESL 66 to expose source/drain silicide regions 50, 52, and 60, and the silicide regions 45 and 55. Contact plugs 72 are then formed in the openings. As is known in the art, contact plugs 72 may include tungsten.

Figure 7A:
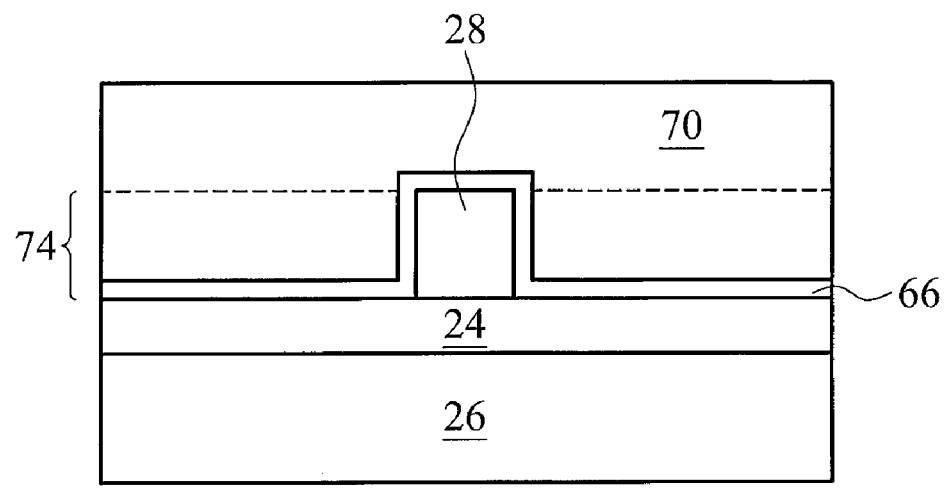
Figure 7B:
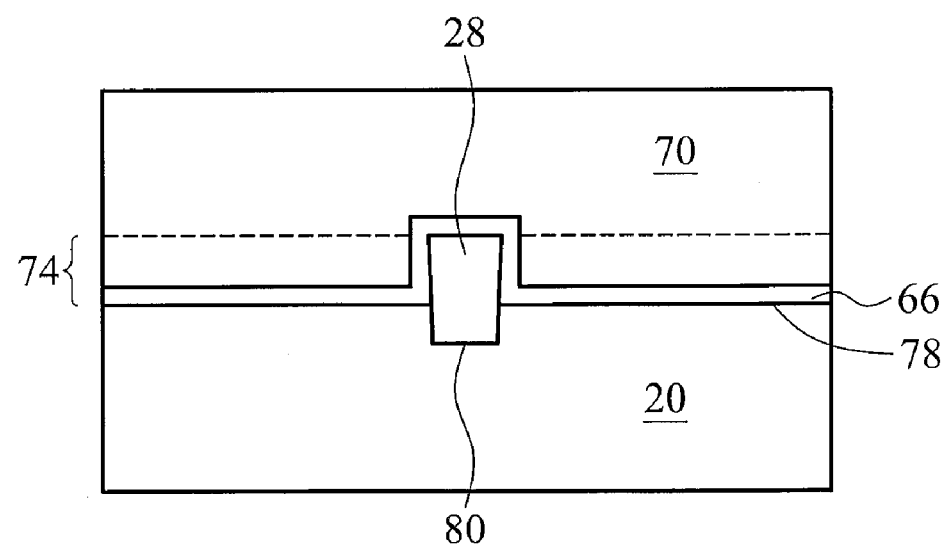

FIGS. 7A and 7B illustrate further cross-sectional views taken along a plane crossing line D-D' as shown in FIG. 6B. FIG. 7A illustrates the embodiment formed on an SOI substrate. The bottoms of STI regions 28 and the bottoms of STI regions 74 (including CESL 66) all extend to BOX layer 22, and hence are leveled to each other. FIG. 7B illustrates STI regions 28 formed in bulk substrate 20. In this case, the bottoms 80 of STI regions 28 may be higher than, substantially leveled with, or lower than, the bottoms 78 of STI regions 74. Further, it is realized that the bulk of STI regions 28 and 74 (excluding the STI liners and CESL 66) may be formed of a same material, for example, silicon oxide, or different materials. Also, the bulk of STI regions 28 and 74 may be formed using different formation methods even if they are formed of a same material. In this case, STI regions 28 and 74 may still be distinguished from each other because of their different characteristics. In an exemplary embodiment, the bulk of STI regions 74 have a lower density than STI regions 28.

Figure 8:
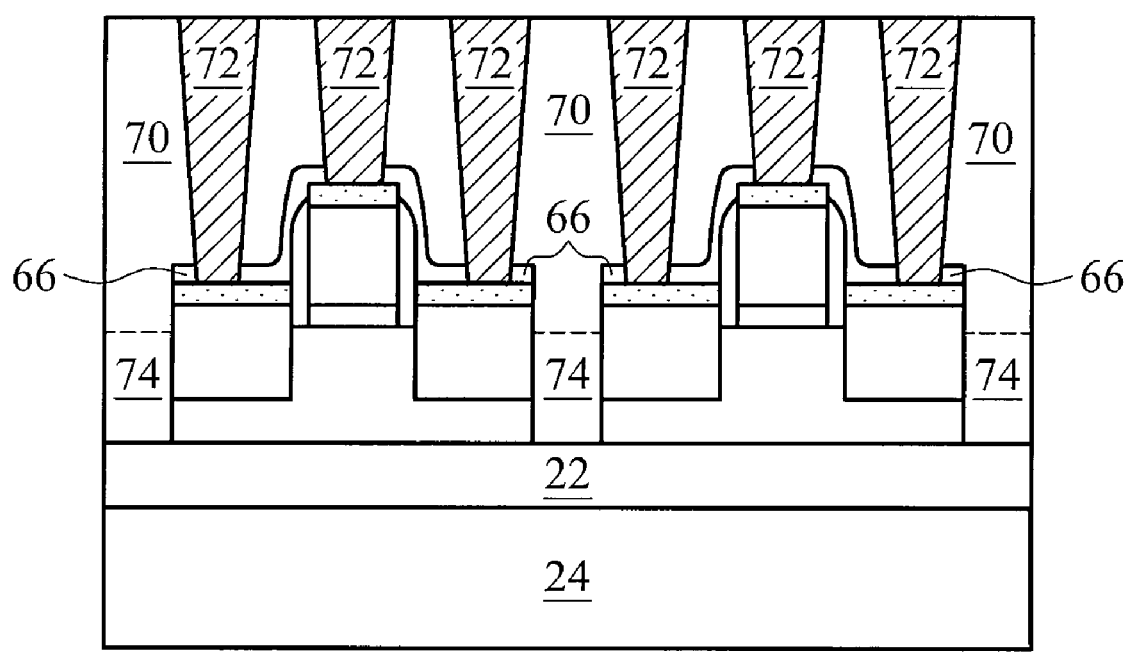

FIG. 8 illustrates an alternative embodiment of the present invention. In this embodiment, the formation and the filling of trenches 64 (refer to FIG. 5) is performed after the formation of CESL 66, but before the formation of ILD 70. Accordingly, CESL 66 is etched during the formation of trenches 64, and hence the resulting STI regions 74 do not include CESL 66.

Figure 9:
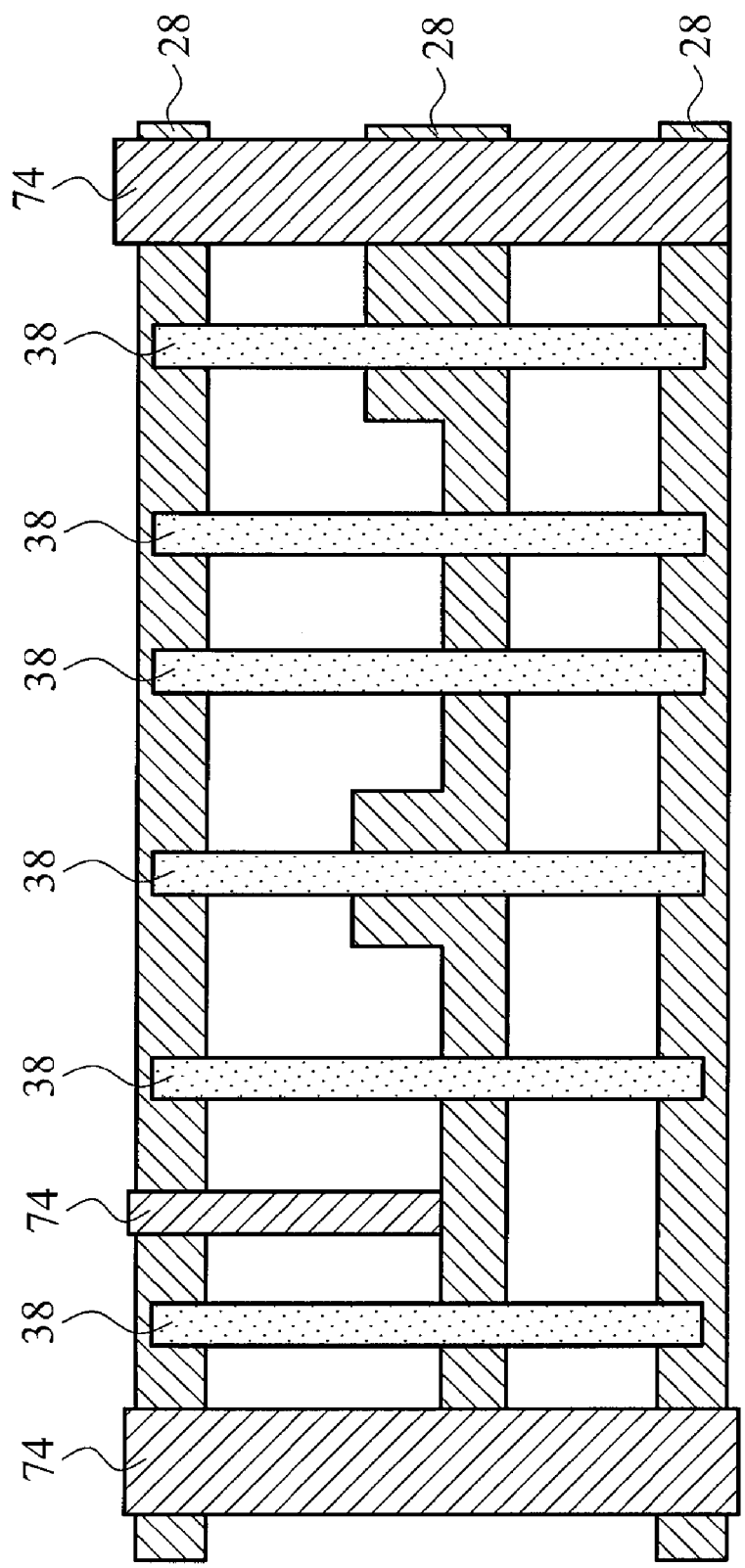
FIG. 9 illustrates a top view of an integrated circuit structure, wherein shallow trench isolation (STI) regions have irregular shapes.

Referring to FIG. 9, STI regions 28 and/or STI regions 74 may not form rectangular patterns, and the MOS devices may not be fully surrounded by the STI regions. However, the same teaching applies, and the portions of STI regions having no gate electrode strips formed thereon may be formed using the same methods, and formed simultaneously as, STI regions 74, while the portions of STI regions having gate electrode strips formed thereon may be formed using the same methods, and formed simultaneously as, STI regions 28. Alternatively, the portions of STI regions having lengthwise directions parallel to the source-to-drain direction of the adjacent (or adjoining) MOS devices may be formed using the same methods, and formed simultaneously as, STI regions 28, while the portion of STI regions having lengthwise directions not parallel to (for example, perpendicular to) the source-to-drain direction of the adjacent (or adjoining) MOS devices may be formed using the same methods, and formed simultaneously as, STI regions 74. Since STI regions 74 typically have smaller widths than the widths of STI regions 28, voids or other types of defects may be formed in STI regions 74. However, since STI regions 74 are formed after the high-temperature steps have been performed, the defect will not cause adverse stresses in the direction parallel to the source-to-drain direction of MOS devices 40 and 42.

FIG. 10 illustrates yet another embodiment of the present invention. In this embodiment, NMOS devices 140 and 142 are formed on a same substrate 20 as PMOS devices 40 and 42. Again, STI regions 74 may be formed using the same method, and formed simultaneously, as the formation of STI regions 74 as shown in FIGS. 6A and 6B. In alternative embodiments, one type of MOS devices, such as PMOS devices are surrounded by STI regions 28 and 74, as is shown in FIG. 6B, while on the same substrate 20 (in the same semiconductor chip 18), another type of MOS devices, such as NMOS devices, are surrounded by STI regions 28 only. This embodiment may be used if the stresses applied to the source-to-drain direction of the adjacent (or adjoining) MOS devices are beneficial for the performance of the MOS devices.

The embodiments of the present invention have several advantageous features. By adopting a two-step formation of STI regions, the adverse stresses applied to the MOS devices adjacent to the STI regions are reduced. The fluctuation in the dopant concentration is also reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
a semiconductor substrate comprising an active region;
a first shallow trench isolation (STI) region contacting a first side edge of the active region;
a gate electrode over the active region and the first STI region;
a source/drain region adjacent the gate electrode, with a portion of the active region forming the source/drain region;
a trench in the semiconductor substrate and contacting a second side edge of the active region;
an inter-layer dielectric (ILD) extending from over the gate electrode to inside the trench, wherein a portion of the ILD in the trench forms a second STI region; and
a contact etch stop layer (CESL) underlying the ILD, wherein the CESL does not extend into the trench.

2. The integrated circuit structure of claim 1, wherein the trench has a bottom not higher than a bottom of the source/drain region.

3. The integrated circuit structure of claim 1, wherein the first and the second side edges of the active region join each other, and wherein the second side edge of the active region is parallel to a lengthwise direction of the gate electrode.

4. The integrated circuit structure of claim 1 further comprising a buried oxide layer buried inside the semiconductor substrate, wherein bottoms of the first and the second STI regions contact the buried oxide layer.

5. The integrated circuit structure of claim 1, wherein the semiconductor substrate is a bulk substrate, and wherein the first and the second STI regions extend to different depths into the semiconductor substrate.

6. The integrated circuit structure of claim 1, wherein the first and the second STI regions comprise different materials.

7. An integrated circuit structure comprising:
a semiconductor substrate comprising a first active region and a second active region;
a first shallow trench isolation (STI) region in the semiconductor substrate, wherein the first STI region contacts the first and the second active regions;
a first gate electrode strip directly over the first active region and the first STI region;
a second gate electrode strip directly over the second active region and the first STI region, wherein the first and the second gate electrode strips are substantially parallel to each other;
a first source/drain region in the first active region and adjacent the first gate electrode strip;
a second source/drain region in the second active region and adjacent the second gate electrode strip;
an inter-layer dielectric (ILD) having a top surface higher than top surfaces of the first and the second gate electrode strips, wherein the ILD extends into the semiconductor substrate to form a second STI region contacting sidewalls of the first and the second source/drain regions and
a contact etch stop layer (CESL) underlying the ILD, wherein the CESL does not extend into the semiconductor substrate.

8. The integrated circuit structure of claim 7, wherein lengthwise directions of the first and the second STI regions are not parallel to each other.

9. The integrated circuit structure of claim 8, wherein the lengthwise directions of the first and the second STI regions are perpendicular to each other.

10. The integrated circuit structure of claim 7, wherein the first and the second STI regions extend to different depths into the semiconductor substrate.

11. An integrated circuit structure comprising:
a semiconductor substrate comprising an active region;
a first shallow trench isolation (STI) region in the semiconductor substrate;
a metal-oxide-semiconductor (MOS) device comprising:
a gate stack directly over the active region and the first STI region;
a source/drain region adjacent the gate stack and in a portion of the active region; and
a source/drain silicide region over the source/drain region; and
a second STI region in the semiconductor substrate, wherein the source/drain region and the source/drain silicide region comprise first portions contacting the first STI region, and second portions contacting the second STI region, and wherein top surfaces of the second portions are flatter than top surfaces of the first portions.

12. The integrated circuit structure of claim 11 further comprising an inter-layer dielectric (ILD) having a top surface higher than a top surface of the gate stack, wherein the ILD and the second STI region are formed of a same material, and in combination form a continuous region with no material different from the material of the ILD disposed between the ILD and the second STI region.

13. The integrated circuit structure of claim 12 further comprising a contact etch stop layer (CESL) underlying the ILD, wherein portions of the CESL extend into the semiconductor substrate to form sidewall portions and a bottom portion of the second STI region.

14. The integrated circuit structure of claim 12 further comprising a CESL underlying the ILD, wherein no portion of the CESL extends into the semiconductor substrate to form a portion of the second STI region.

15. The integrated circuit structure of claim 11, wherein the first and the second STI regions comprise different materials.

16. The integrated circuit structure of claim 11, wherein the first and the second STI regions are formed of a same material, and have different densities.

* * * * *